(12) United States Patent
Martin et al.

(10) Patent No.: US 6,465,280 B1
(45) Date of Patent: Oct. 15, 2002

(54) IN-SITU CAP AND METHOD OF FABRICATING SAME FOR AN INTEGRATED CIRCUIT DEVICE

(75) Inventors: John R. Martin, Foxborough; Richard H. Morrison, Jr., Taunton, both of MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/800,821

(22) Filed: Mar. 7, 2001

(51) Int. Cl.[7] ............................................. H01L 21/76
(52) U.S. Cl. ..................... 438/125; 438/106; 438/127; 438/121; 438/123; 438/124; 257/704; 257/687; 257/417; 257/659
(58) Field of Search ................................ 438/125, 106, 438/127, 121, 123, 124; 257/704, 687, 417, 659

(56) References Cited

U.S. PATENT DOCUMENTS

| | | | |
|---|---|---|---|
| 4,701,424 A | 10/1987 | Mikkor | |
| 4,791,075 A | 12/1988 | Lin | |
| 4,907,065 A | 3/1990 | Sahakian | |
| 5,150,196 A | 9/1992 | Yamamoto et al. | |
| 5,323,051 A | 6/1994 | Adams et al. | |
| 5,490,628 A | 2/1996 | Beatty | |
| 5,831,162 A | 11/1998 | Sparks et al. | |
| 6,062,461 A | 5/2000 | Sparks et al. | |
| 6,323,550 B1 * | 11/2001 | Martin et al. | 257/704 |
| 6,358,771 B1 * | 3/2002 | Martin | 438/106 |
| 6,384,473 B1 * | 5/2002 | Peterson et al. | 257/680 |

FOREIGN PATENT DOCUMENTS

WO WO 00/42636 * 7/2000

* cited by examiner

Primary Examiner—Matthew Smith
Assistant Examiner—Belur V Keshavan
(74) Attorney, Agent, or Firm—Iandiorio & Teska

(57) ABSTRACT

An in-situ cap for an integrated circuit device such as a micromachined device and a method of making such a cap by fabricating an integrated circuit element on a substrate; forming a support layer over the integrated circuit element and forming a cap structure in the support layer covering the integrated circuit element.

31 Claims, 8 Drawing Sheets

IN-SITU CAP AND METHOD OF FABRICATING SAME FOR AN INTEGRATED CIRCUIT DEVICE

FIELD OF THE INVENTION

This invention relates to an in-situ cap for an integrated circuit device such as a micromachined device and to a method of making such an in-situ cap.

BACKGROUND OF THE INVENTION

Conventional caps for integrated circuit devices such as micromachined devices are often used to protect and isolate. Typically the caps are made independently of the device itself and then attached after the device fabrication is completed. Often the cap is fabricated from silicon and fastened to the devices with an organic adhesive or with an inorganic glass or metal. While this approach can be satisfactory, it does require separate processes to make the caps and then to join them to the integrated circuit devices. One set of joining processes applies caps to integrated circuit devices before the wafers are singulated. This requires expensive wafer scale processes and equipment. Cap stress effects can cause yield loss if the process is not tightly controlled. However, a tightly controlled wafer level process protects the delicate micromachined devices early in the manufacturing process. Another set of processes applies the caps after singulation. This can be simpler to implement but it requires special precautions to avoid contamination during wafer singulation and other process steps. Still another approach eliminates the requirement for directly attaching caps to the integrated circuit devices by mounting and wire bonding the devices inside cavity packages. In essence, the next level package becomes the cap. This method often utilizes expensive hermetically sealed ceramic or metal packages. It also requires that the manufacturing facility maintain unusual cleanliness standards in order to avoid contamination during assembly of the delicate micromachined devices.

SUMMARY OF THE INVENTION

It is therefore an object of this invention to provide an improved in-situ cap for integrated circuit devices including micromachined devices and a method of making it.

It is a further object of this invention to provide such a cap and method which utilize the basic integrated circuit fabrication process to make the cap as well.

It is a further object of this invention to provide such a cap and method which provides the cap as an integrated in-situ part of the device itself.

It is a further object of this invention to provide such a cap and method which require no special or independent effort to make or install the cap.

It is a further object of this invention to provide such a cap and method in which the cap can be used to preserve a suitable environment within the cap such as a gas or liquid fill or a vacuum.

It is a further object of this invention to provide such a cap and method which protects the capped device immediately upon completion of the processing before any further handling including die separation, testing and handling.

It is a further object of this invention to provide such a cap and method which has much lower manufacturing cost.

It is a further object of this invention to provide such a cap and method in which post-processing is made easier because the devices are less vulnerable since they are capped at the end of wafer processing before die cutting.

It is a further object of this invention to provide such a cap and method which requires the same low temperature processing as the rest of the integrated circuit.

The invention results from the realization that a truly improved, more robust, simpler and less expensive in-situ cap for an integrated circuit device and method of making such a cap can be achieved by fabricating a cap in-situ on an integrated circuit device as a part of the integrated circuit fabrication process by forming a support layer on the integrated circuit device and then forming the cap structure in the support layer covering the integrated circuit element.

This invention features a method of fabricating an in-situ cap for a micromachined device including fabricating a micromachined element on a substrate with a sacrificial support layer intact and fabricating a cap sacrificial support layer over the micromachined element. The cap structure is formed in the sacrificial layers covering the micromachined element and the sacrificial layers are removed within the cap structure to release the micromachined element leaving an in-situ cap integral with the device.

In a preferred embodiment forming the cap structure may include forming a cap hole around the element. Forming the cap structure may also include filling the cap hole to form a cap wall and covering the sacrificial layers to form a top connected with the cap wall. The cap may be formed with at least one hole and removing the sacrificial layers may include introducing a release agent through the hole in the cap. The substrate may be formed with at least one hole and removing the sacrificial layers may include introducing release agent through the hole in the substrate. The cap hole may be closed to seal the cap. A fluid filler may be introduced through the cap hole into the cap surrounding the micromachined element. The cap hole may be closed to seal in the fluid. The cap hole may be small and the surface tension of the fluid may prevent its escape. Fabricating a cap may include forming a contact on the cap. The micromachined element may include a switch and the contact may be a terminal of the switch. Fabricating a cap may also include forming a gate electrode on the cap for operating the switch. The fluid may be a crosslinkable material; the volume in the cap may be a vacuum; the fluid may modify a surface inside the cap.

This invention also features a method of fabricating an in-situ cap for an integrated circuit device including fabricating an integrated circuit element on a substrate, forming a support layer over the integrated circuit element and forming a cap structure in the support layer covering the integrated circuit element.

In a preferred embodiment the method may further include removing the support layer within the cap structure.

This invention also features a micromachined device with an in-situ cap including a substrate, a micromachined element on the substrate and an in-situ cap integral with the substrate and covering the element. There is at least one conductor extending from the element under the cap through the substrate to an external terminal.

In a preferred embodiment, the cap may be filled with liquid; the liquid may be a dielectric. The micromachined element may include a switch; the cap may include a hole; the micromachined element may include an optical device; and the hole may be an optical port. The cap may include a contact; the micromachined element may include a switch; and the contact may be a terminal of the switch. The cap may include a gate electrode for operating the switch.

This invention also features a micromachined device with an in-situ cap including a substrate, a micromachined element on the substrate, and an in-situ cap integral with the substrate covering the element. The micromachined element may be an optical device and there may be an optical port for accessing the optical device. In a preferred embodiment, the port may be in the cap.

This invention also features a micromachined device with an in-situ cap including a substrate, a micromachined element on the substrate, and an in-situ cap integral with substrate and covering the element. There may be a liquid disposed in the cap.

In a preferred embodiment the liquid may be a dielectric.

This invention also features an integrated circuit device with an in-situ cap including a substrate, an integrated circuit element on the substrate, and an in-situ cap integral with the substrate and covering the element. At least one conductor may extend from the element under the cap through the substrate to an external terminal.

This invention also features an integrated circuit device with an in-situ cap including a substrate, an integrated circuit element on the substrate, and an in-situ cap integral with the substrate and covering the element. The integrated circuit element may be an optical device and there may be an optical port for accessing the optical device.

This invention also features an integrated circuit device with an in-situ cap including a substrate, an integrated circuit element on the substrate, and an in-situ cap integral with the substrate and covering the element. A liquid may be disposed in the cap.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
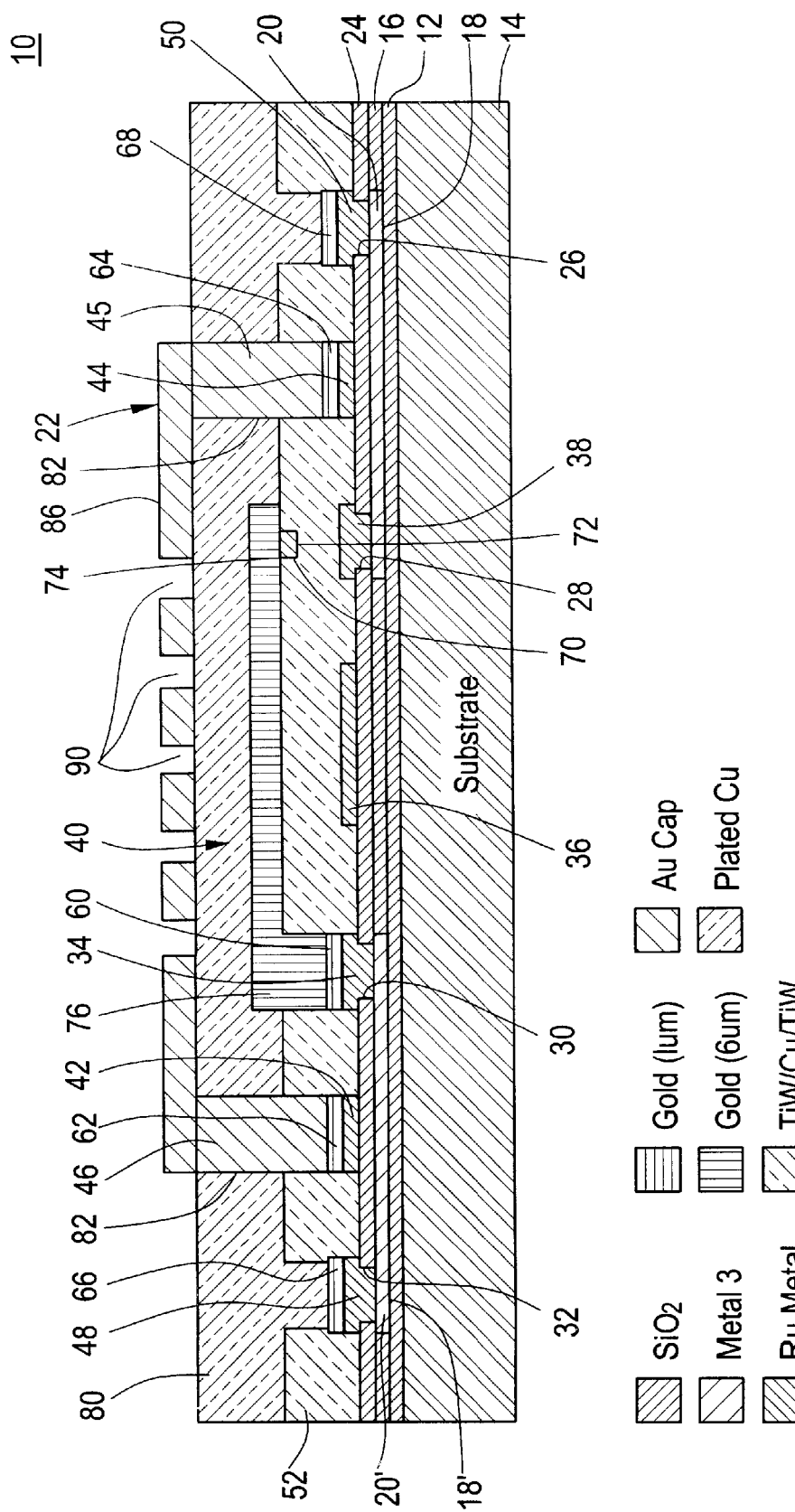
FIG. 1 is a schematic side elevational sectional diagram of an integrated circuit device, namely a micromachined device, as it appears during the method of this invention just prior to release of the sacrificial support layers in the cap.

There shown in FIG. 1 a micromachined switch device 10 which has been fabricated in accordance with this invention as it appears just before the removal of the sacrificial layers within the in-situ cap which was formed as a part of the basic processing of the integrated circuit itself. The fabrication begins with the application of a silicon dioxide layer 12 onto silicon substrate 14. A second layer 16 of silicon dioxide is laid down on layer 12 and is then masked to permit etching of the holes 18 in layer 16. After these holes are etched they are filled with aluminum to form conductors 20, 20'. These conductors function to make electrical interconnection between the micromachined element or other integrated circuit element inside of cap 22 and external circuits. The third silicon dioxide layer 24 is formed on layer 16. Layer 24 is now masked to expose holes 26, 28, 30 and 32 which are then formed by etching. After this another metal layer is deposited on layer 24 leaving exposed holes 26, 28, 30 and 32. This metal, such as Ru, (however any metal which provides a low and stable resistance would be suitable), is sputter deposited approximately 0.1 micron thick. This layer is masked and etched, the mask is removed and the remaining Ru metal forms contacts to the under-lying Al metal 38, 48 and 50 and at the same time forms the source 34, gate 36 and drain 38 of the micromachined element and forms the anchors 42, 44 for the wall 46 of the cap. Also pads 48 and 50 constitute the terminals to be wire bonded to external circuits. After this, a first sacrificial layer 52 is formed. Sacrificial layer 52 is masked to create hole 70 approximately ⅓ the thickness of the sacrificial layer and then a deposit of a metal such as Ru, (however any metal which provides a low and stable resistance would be suitable), is made to fill the hole 70 to create tip contact 72. Sacrificial layer 52 is masked again to expose holes communicating with Ru pads 34, 42, 44, 48 and 56. A thin layer of Au e.g. 1.0 micron thick, is now formed on these selected Ru pads, i.e. gold layers 60, 62, 64, 66 and 68. Layer 52 is masked once again to expose the space for the beam 74 and for the anchor 76 of micromachined element, switch 40. A gold layer is deposited to create arm 74 and post 76 as shown, and then, a second sacrificial layer 80 is added. Layer 80 is masked to create holes 82 which are etched right down to the gold layers 62 and 64. After this, layer 80 is masked to create the top plate 86 of cap 22 and the gold is deposited to fill wall 45 and top 86 to complete the structure of cap 22. In this particular embodiment cap 22 is formed with a number of holes 90 which serve to accept a release agent that is introduced through them to release the sacrificial layers 52 and 80 inside of cap 22. The phrase integrated circuit device or micromachined device refers generally to the assembly 10 whereas the phrase integrated circuit element or micromachined element refers to the things under the caps, e.g. switch 40.

Figure 2:
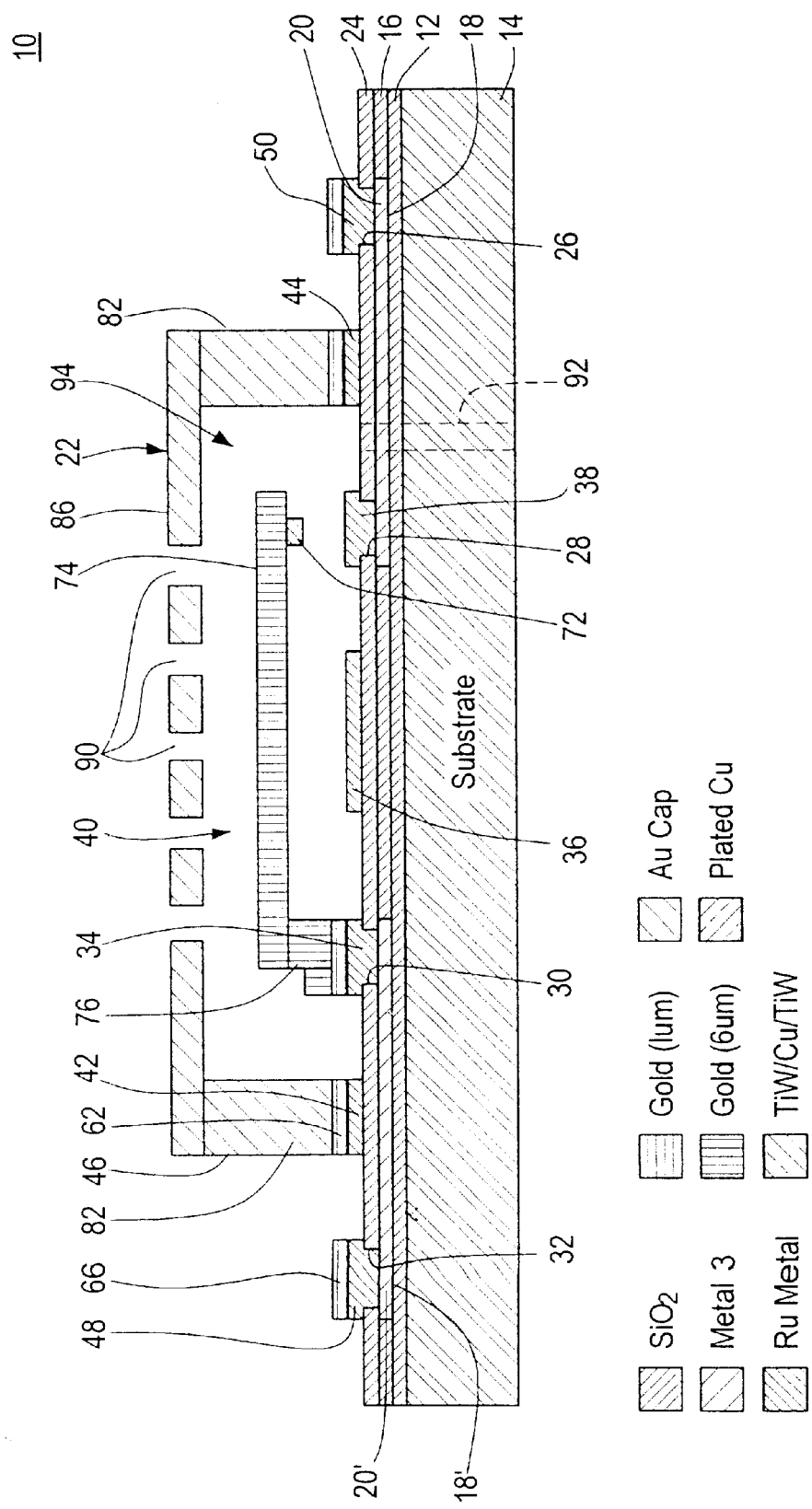
FIG. 2 is a view similar to FIG. 1 after the release of the sacrificial support layer showing the device with in-situ cap according to this invention.

When this is done, the complete device appears as in FIG. 2. This cavity can now be sealed with an epoxy or a similar sealant in holes 90 or may be left open. If switch 40, or another micromachined element or other integrated circuit element had optical portions one of more of holes 90 could be used as an optical port and as a hole for accepting a release agent similar to hole 90. Alternatively, a hole 92 through substrate 14 could be used as an optical access port and as a hole for accepting a release agent similar to hole 90. Often the cavity 94 formed in cap 22 is to contain a predetermined environment such as a vacuum or an inert gas or a dielectric liquid to assist or enhance the operation of the switch or other micromachined device or integrated circuit device protected and isolated by cap 22. If this is the case, it may be desired to seal hole 90 to keep in the fluid or seal the vacuum. In some cases the holes may be simply made small enough so that the surface tension of the liquid prevents leakage or evaporation. Alternatively a reactive liquid can be used, for example, such material can polymerize to a high molecular weight material or crosslink into a gel or solid form: such products would not leak out through the hole. Examples would include reactive silicone gels, epoxies, protein/water solutions. Alternatively a fluid can be introduced which modifies a surface in the cap such as a surface of the cap or of the micromachined device to reduce stictioh, passivate or impart some specific chemical reactivity on the surfaces (biological applications). For example, HMDS (Hexamethyldisilazane) can be vapor deposited for reducing stiction. If the integrated circuit element is not a device that needs to be free to move the sacrificial layer may not need to be removed. In fact it may be beneficial to keep it there if, for example, it has optical or electrical or thermal insulating properties that are desirable and a coefficient of expansion that is compatible or just for support.

Figure 3:
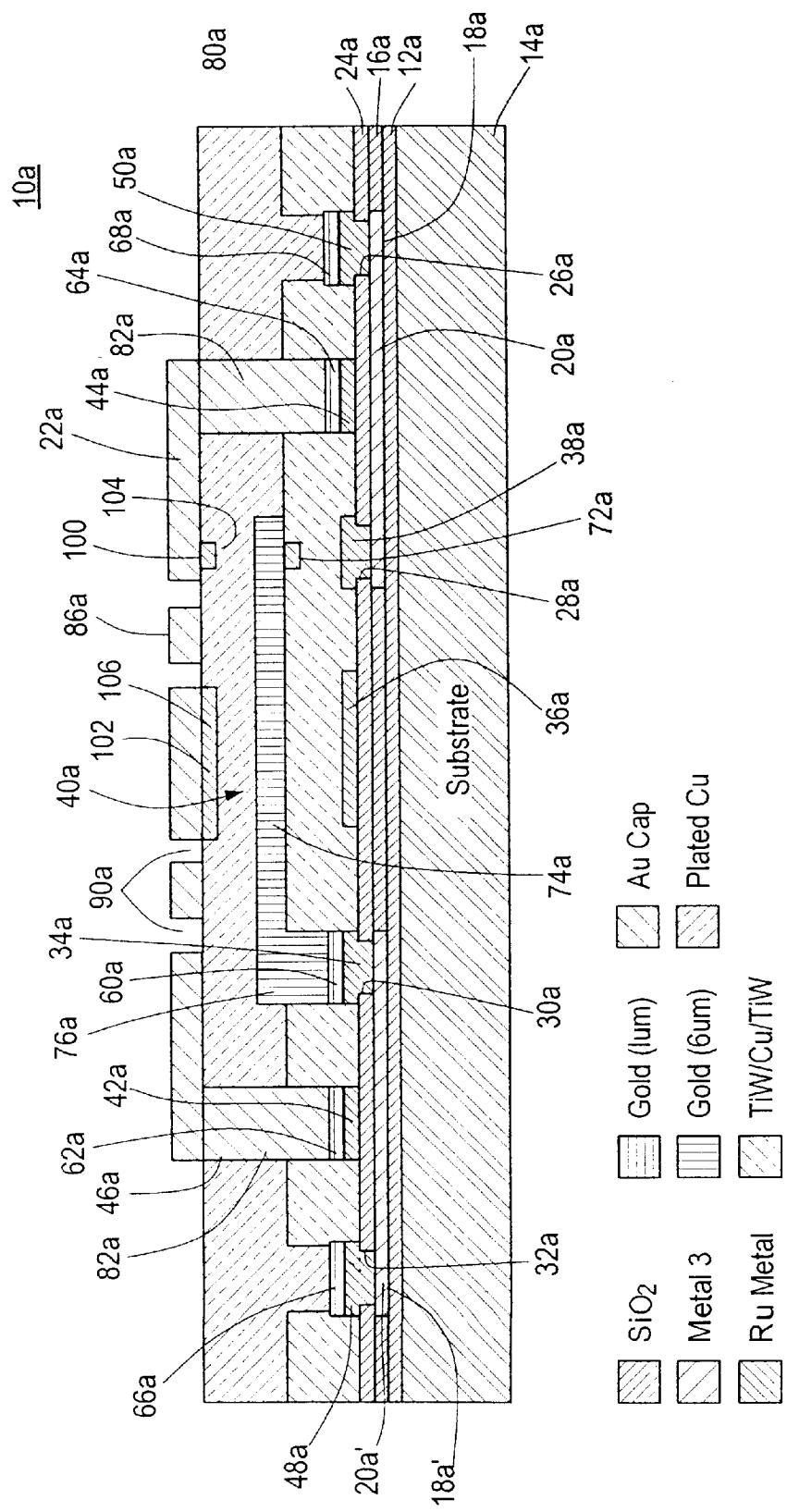
FIG. 3 is a view similar to FIG. 1 in which the micromachined switch element includes an additional terminal and counter gate on the cap.

In another embodiment switch 40*a*, FIG. 3, may be fabricated as a double throw switch by forming another contact tip 100 and another counter gate electrode 102 directly on cap 22*a*. In this case, another step is inserted before the cap is formed. In this step, layer 80*a* is masked to provide the holes 104, 106, in which the Ru can be deposited to create tip contact 100 and counter gate electrode 102. Then the required steps are performed to create cap 22*a*. After removal of the sacrificial layers the device appears as shown in FIG. 4 as a fully operable micromachined double throw switch.

Figure 5:
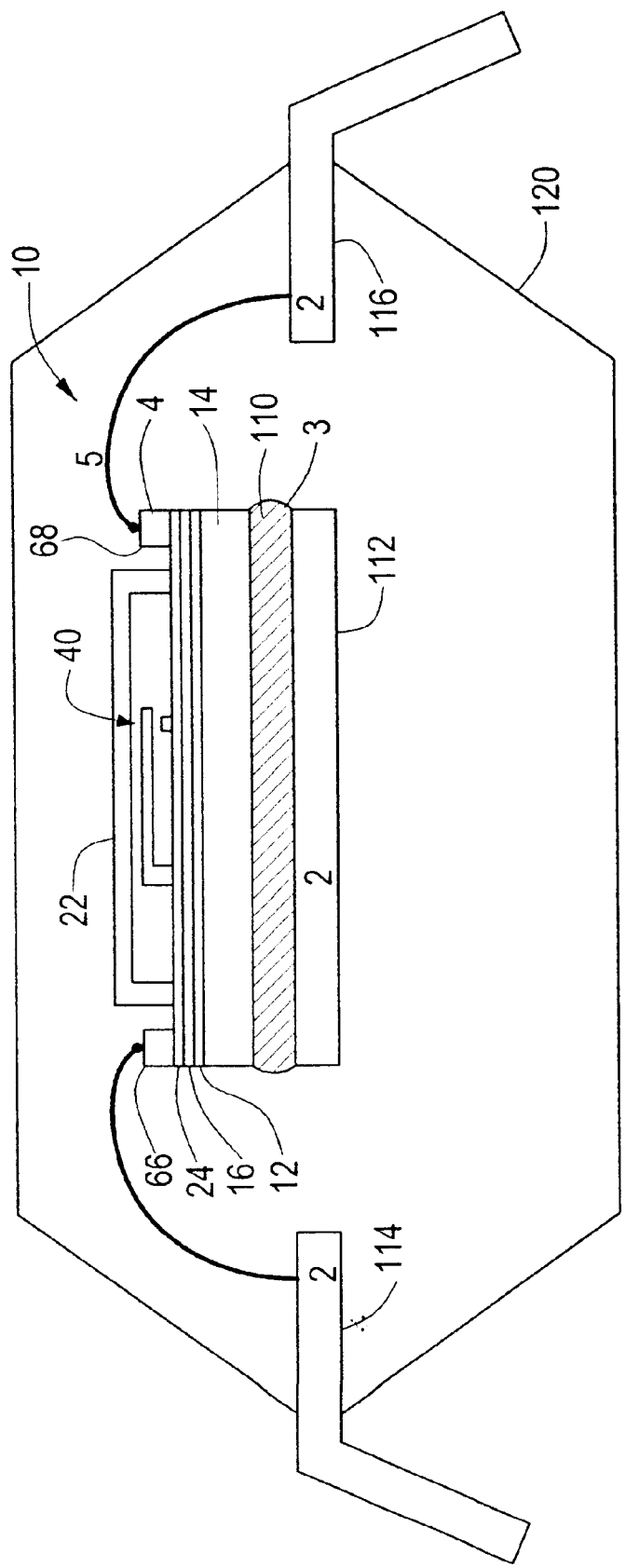
FIG. 5 is a schematic side elevational sectional view of a micromachined device with in-situ cap according to this invention after packaging.
Figure 6:
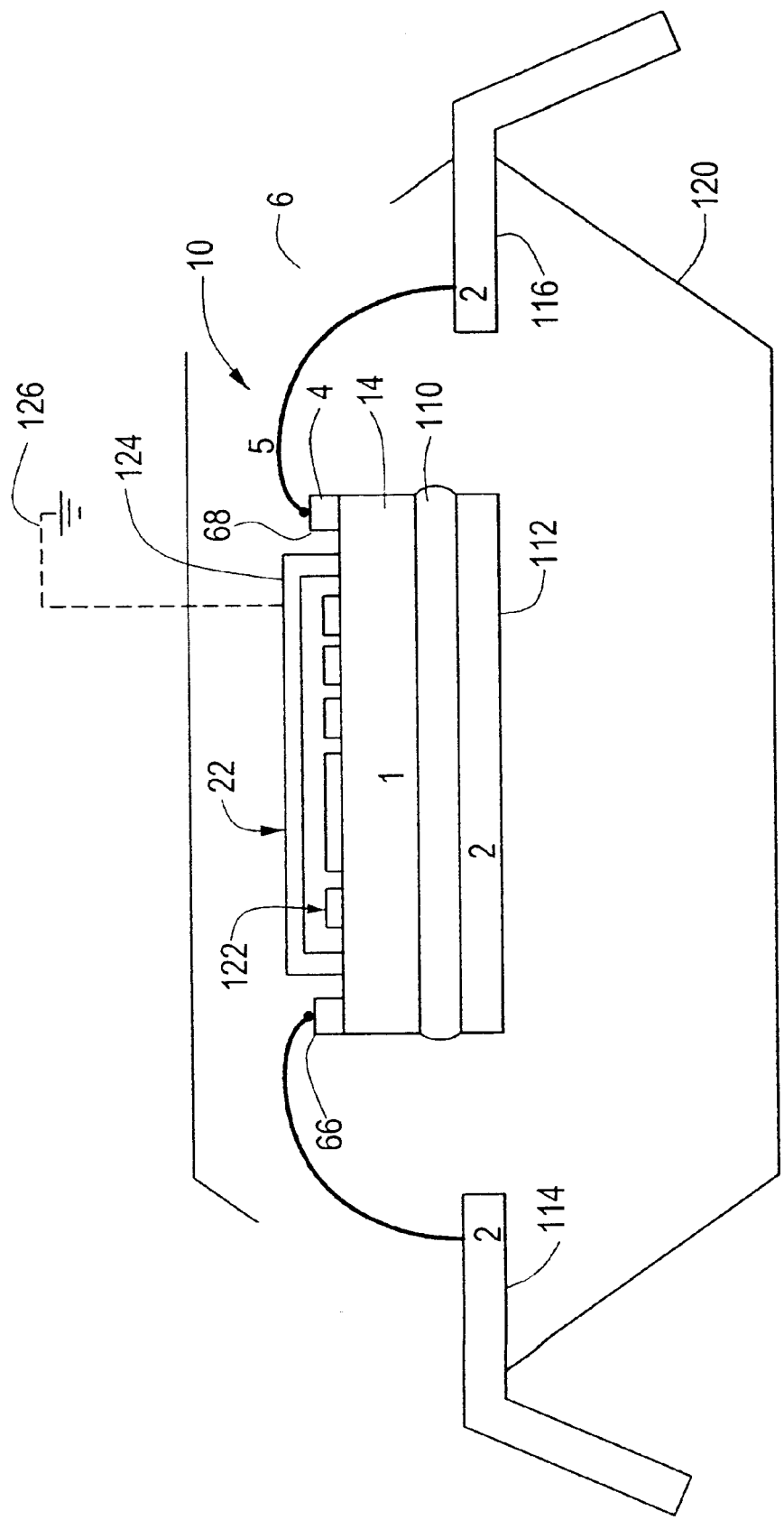
FIG. 6 is a view similar to FIG. 5 of an integrated circuit device generally with an in-situ cap according to this invention.

Typically, device 10 or 10*a* is die attached at 110, FIG. 5, to a paddle or lead frame 112 whose contacts 114, 116 are wire bonded to contacts 66 and 68 with the entire device packaged in housing 120. As indicated previously, the cap and the method of fabricating it is not limited to micromachined devices, but is equally applicable to other types of integrated circuit devices as shown in FIG. 6 where instead of switch 40, an integrated circuit element 122 such as an ASIC, microprocessor or the like has been encapsulated by cap 22. In this particular case the purpose of the cap instead of just protection or isolation may have been alternatively or in addition to provide a Faraday cage by providing for example a metallized outer layer 124 and grounding it as at 126 to provide shielding.

Figure 4:
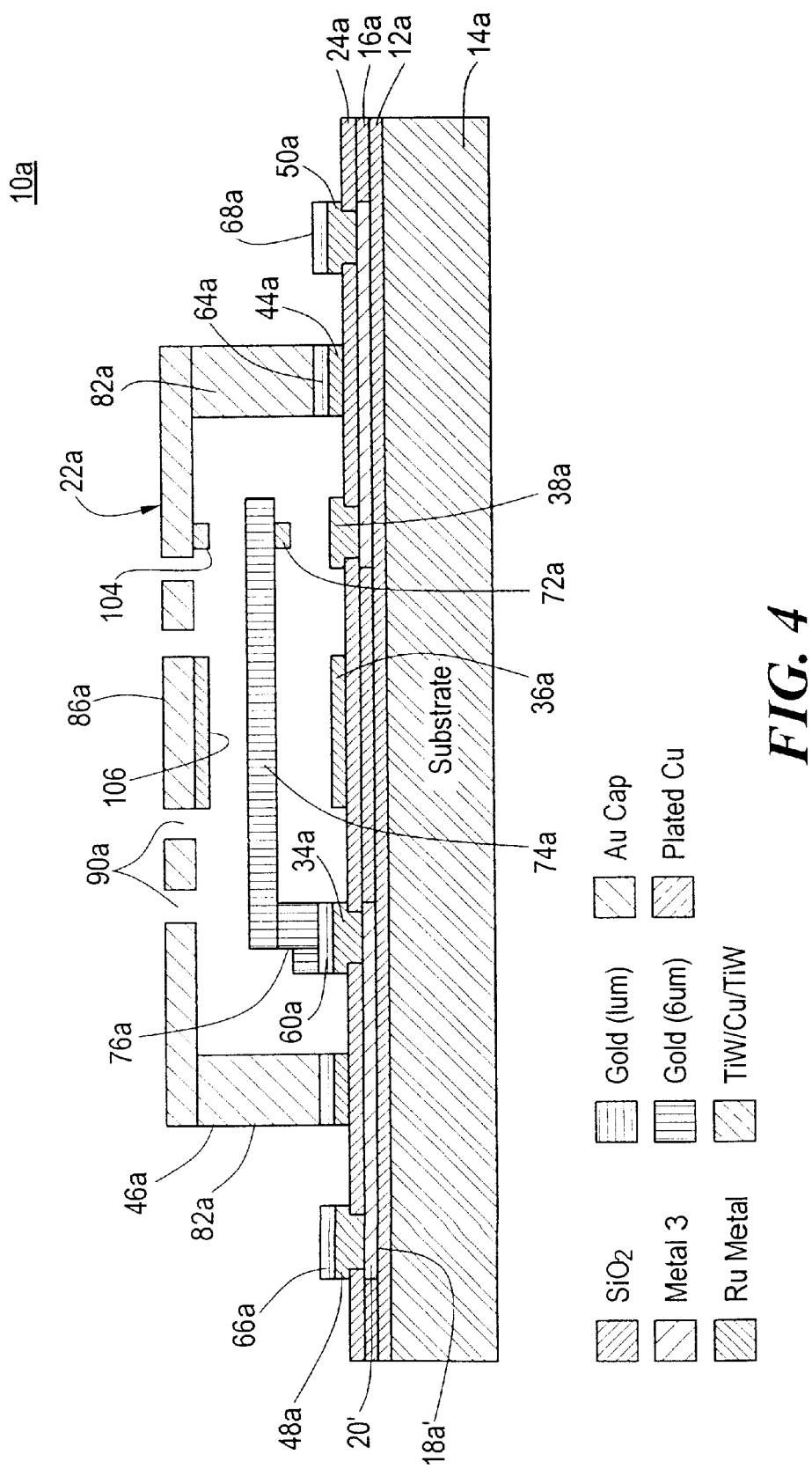
FIG. 4 is a view similar to FIG. 2 of the device of FIG. 3.
Figure 7A:
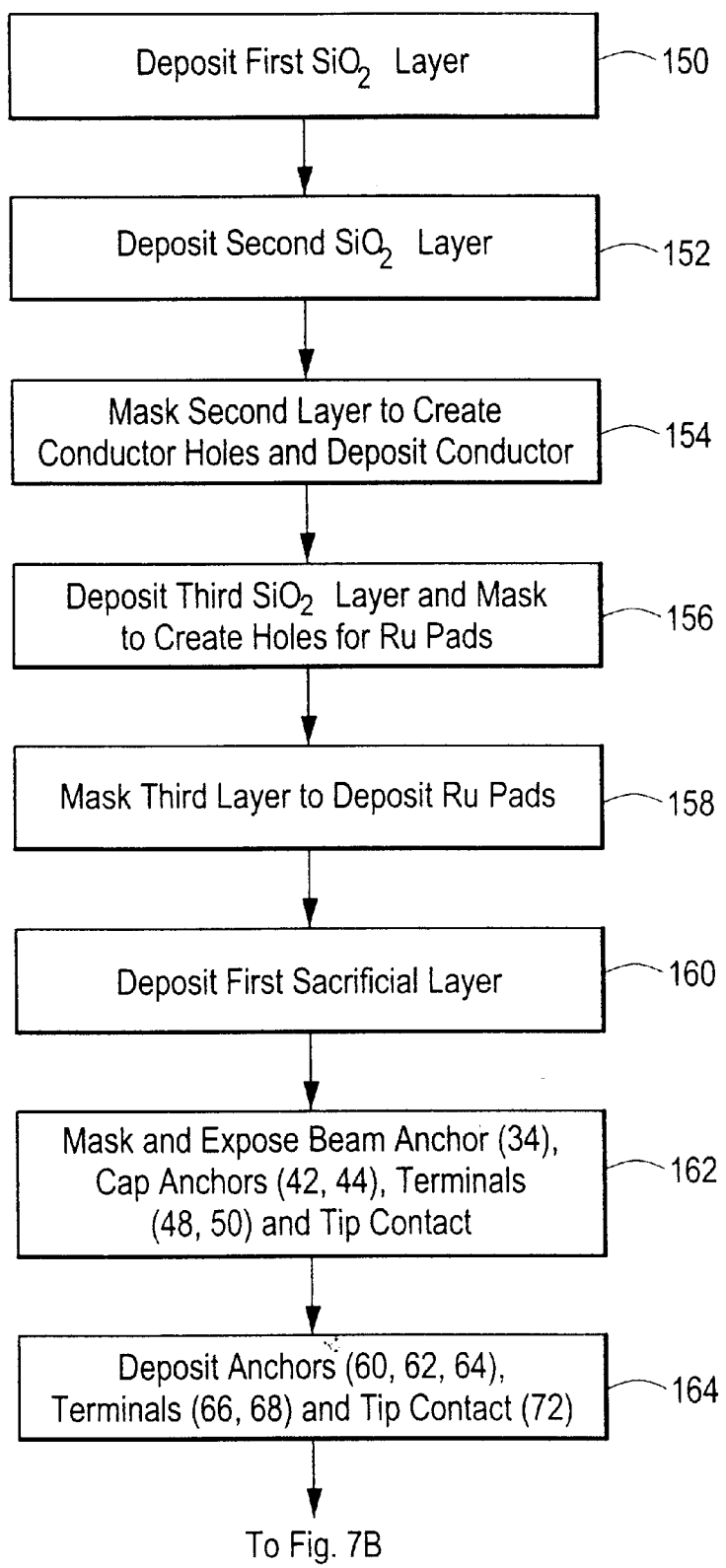
FIGS. 7A and B are a flow chart of a process according to this invention.
Figure 7B:
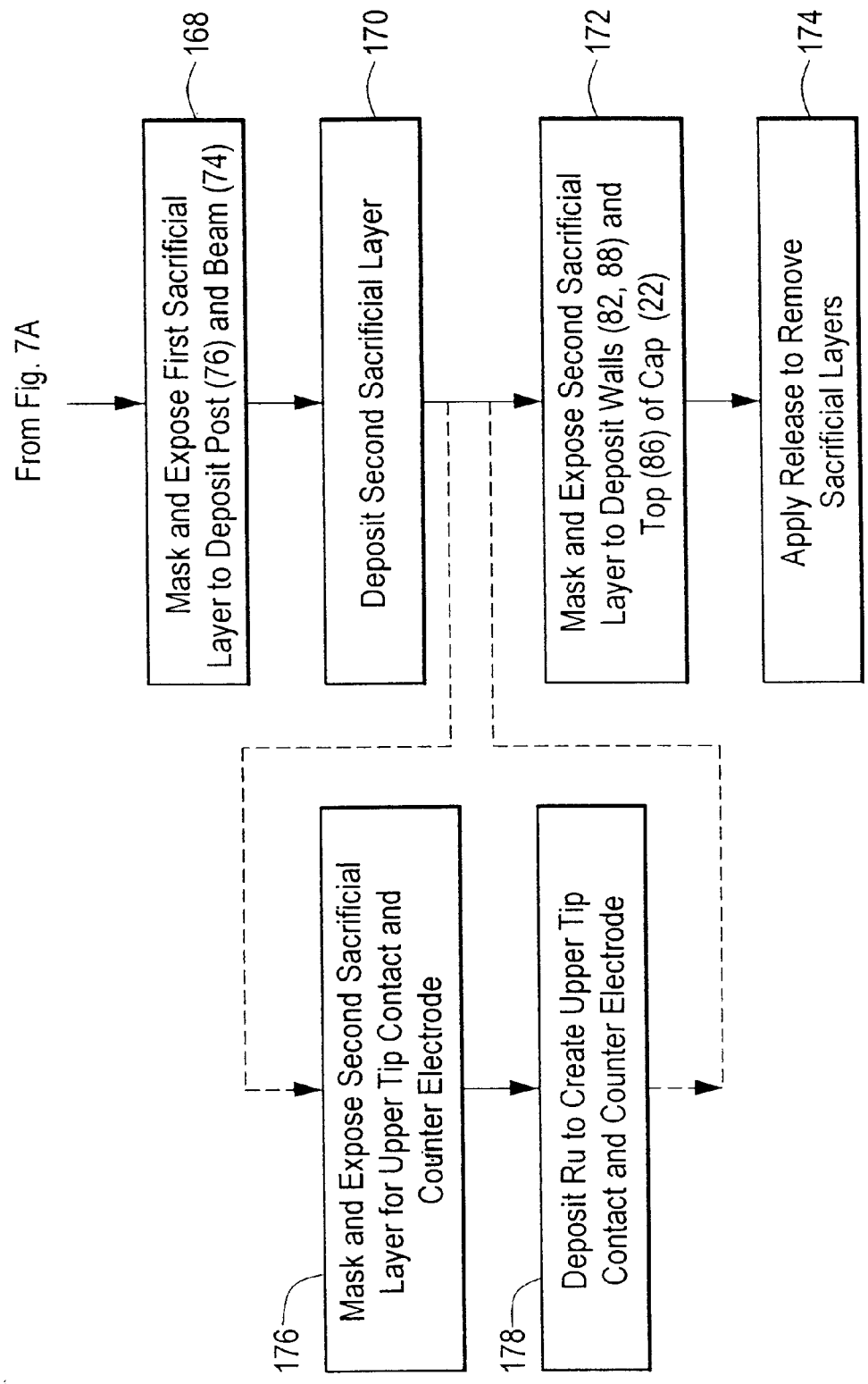

The method for creating the devices of FIGS. 1 and 2 and FIGS. 3 and 4 is shown in flow chart form in FIGS. 7A and B beginning with depositing the first insulator, such as silicon dioxide, step 150, depositing the second silicon dioxide layer 152, and then masking the second layer to create holes and deposit, mask and etch a conductor layer, step 154. The third silicon dioxide layer is deposited and etched to create holes for the Ru to contact the conductor pads 26, 28, 30, 32, step 156. A metal such as Ru (however any metal which provides a low and stable resistance would be suitable), is deposited, masked and etched to form 34, 36, 38, 42, 44, 48 and 50, step 158. Then the first sacrificial layer 52 is deposited, step 160. The first sacrificial layer is masked and etched to create tip contact 72, and masked and etched a second time to create the holes for the beam anchor 34, cap anchors 42 and 44 and terminals 48, 50 in step 162. The sacrificial layer is masked again and the Au is deposited to form the beam 74, 76, terminal pads 66, 68 and the wall anchors 62, 64, steps 164 and 168. The second sacrificial layer is then deposited 80, step 170, and then masked and etched to create holes and deposit the wall 46, and the top of the cap 22 in step 172. Finally a release agent is applied to remove the second and first sacrificial layers, step 174. In the construction of FIGS. 3 and 4, the additional steps are added of; masking and etching the second sacrificial layer 80 to form an upper tip 100 and counter electrode 102, step 176; then depositing a metal such as Ru, (however any metal which provides a low and stable resistance would be suitable) masking and etching to define the tip 104 and counter electrode 106, step 178; this would be done between steps 170 and 172.

Further details of the method for creating the device of FIGS. 1 and 2 is shown in chart A and for FIGS. 3 and 4 is shown in chart B.

CHART A

Process Flow for Switch with the In-Situ Cap

Basic Switch Process

| | |
|---|---|
| Sputter Deposit Ru Metal | 0.1 um Thick |
| Photolithography Metal-1 | Defines Source, Gate, Drain and Cap anchors |
| Ion Beam Etch Metal-1 | |
| Strip Photoresist | |
| Sputter Deposit TiW/Cu | 0.03 um/0.6 um |
| Photolithography Tip-1 | Defines Tip-1 Diameter and Depth |
| Ion Beam Etch Tip-1 | 0.3 um |
| Strip Photoresist | |
| Sputter Deposit TiW/Ru | 0.09 um/0.1 um |
| Photolithography Tip-2 | Defines Ru Tip |
| Ion Beam Etch Ru | |
| Strip Photoresist | |
| Photolithography Base Cut | Defines beam anchors and cap anchors |
| Ion Beam Etch Base | |
| Strip Photoresist | |
| Sputter deposit Au/TiW seed | 0.1 um/0.03 um |
| Photolithography Interconnect | Defines Interconnect, Bond Pads, Cap Anchor |
| Au Plate Interconnect | 2.0 um |
| Strip Photoresist | |
| Photolithography Beam | Defines Beam |
| Au Plate Beam | 5–20 um depends on device |
| Strip Photoresist | |
| Add In-Situ Cap | |

| | |
|---|---|
| Photolithography Cu Plate | Defines Cu Spacer layer |
| Plate Cu | 1.0 um |
| Sputter Deposit TiW | 0.03 um |
| Strip Photoresist | |
| Photolithography Cap | Defines Cap |
| Au Plate Cap | 3.0 um |
| Strip Photoresist | |

Release Cap and Beam introduce fill fluid

| | |
|---|---|
| Etch TiW | 95% $H_2O_2$/5% $NH_4OH$ 15 minutes |
| Etch Cap Cu | 75% $DIH_2O$/25% $HNO_3$ 60 minutes |
| Etch TiW | 95% $H_2O_2$/5% $NH_4OH$ 15 minutes |
| Etch Cu | 75% $DIH_2O$/25% $HNO_3$ 60 minutes |
| Etch TiW | 95% $H_2O_2$/5% $NH_4OH$ 15 minutes |
| Evacuate With Vacuum | |
| Introduce Fill Fluid | |
| Photolithography Cap Seal | Defines Photoresist over Cap holes |

CHART B

Process Flow for the In-Situ Cap with Counter Gate Electrode and Upper Tip

Basic Switch Process

| Step | Details |
|---|---|
| Sputter Deposit Ru Metal | 0.1 um Thick |
| Photolithography Metal-1 | Defines Source, Gate, Drain and Cap anchors |
| Ion Beam Etch Metal-1 | |
| Strip Photoresist | |
| Sputter Deposit TiW/Cu | 0.03 um/0.6 um |
| Photolithography Tip-1 | Defines Tip-1 Diameter and Depth |
| Ion Beam Etch Tip-1 | 0.3 um |
| Strip Photoresist | |
| Sputter Deposit TiW/Ru | 0.09 um/0.1 um |
| Photolithography Tip-2 | Defines Ru Tip |
| Ion Beam Etch Ru | |
| Strip Photoresist | |
| Photolithography Base Cut | Defines beam anchors and cap anchors |
| Ion Beam Etch Base | |
| Strip Photoresist | |
| Sputter deposit Au/TiW seed | 0.1 um/0.03 um |
| Photolithography Interconnect | Defines Interconnect, Bond Pads, Cap Anchor |
| Au Plate Interconnect | 2.0 um |
| Strip Photoresist | |
| Photolithography Beam | Defines Beam |
| Au Plate Beam | 5–20 um depends on device |
| Strip Photoresist | |

Added Cap Process with gate counter electrode and 2$^{nd}$ tip

| Step | Details |
|---|---|
| Photolithography Cu Plate | Defines Cu Spacer layer |
| Plate Cu | 1.0 um |
| Strip Photoresist | |
| Sputter Deposit TiW | 0.03 um |
| Photolithography 2nd Tip | Defines 2$^{nd}$ Tip |
| Ion Beam Etch | 0.3 um |
| Strip Photoresist | |
| Sputter Deposit Ru | |
| Photolithography Metal-2 | Defines Counter Gate electrode and 2$^{nd}$ Tip |
| Ion Beam Etch Metal-2 | |
| Strip Photoresist | |
| Sputter Deposit SiO2 | |
| Photolithography Interconnect Oxide | Defines Oxide over Ru to isolate Ru from Cap |
| Etch Oxide | |
| Strip photoresist | |
| Photolithography Cap | Defines Cap |
| Au Plate Cap | 3.0 um |
| Strip Photoresist | |

Release Cap and Beam introduce fill fluid

| Step | Details |
|---|---|
| Etch TiW | 95% $H_2O_2$/5% $NH_4OH$ 15 minutes |
| Etch Cap Cu | 75% $DIH_2O$/25% $HNO_3$ 60 minutes |
| Etch TiW | 95% $H_2O_2$/5% $NH_4OH$ 15 minutes |
| Etch Cu | 75% $DIH_2O$/25% $HNO_3$ 60 minutes |
| Etch TiW | 95% $H_2O_2$/5% $NH_4OH$ 15 minutes |
| Evacuate With Vacuum | |
| Introduce Fill Fluid | |
| Photolithography Cap Seal | Defines Photoresist over Cap holes |

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A method of fabricating an in-situ cap for a micromachined device comprising:

fabricating a micromachined element on a substrate with a sacrificial support layer intact;

fabricating a cap sacrificial support layer over said micromachined element;

forming a cap structure in said sacrificial support layers covering said micromachined element; and removing the sacrificial support layers within said cap structure to release said micromachined element leaving an in-situ cap integrated with the element.

2. The method of claim 1 in which forming said cap structure includes forming a cap hole around said element.

3. The method of claim 2 in which forming said cap structure includes filling said cap hole to form a cap wall and covering said sacrificial support layers to form a top connected with said cap wall.

4. The method of claim 1 in which said cap is formed with at least one hole.

5. The method of claim 4 in which removing the sacrificial support layers includes introducing a release agent through said at least one hole in said cap.

6. The method of claim 4 in which said substrate is formed with at least one hole.

7. The method of claim 6 in which removing the sacrificial support layers includes introducing a release agent through said at least one hole in said substrate.

8. The method of claim 4 in which the cap hole is closed to seal the cap.

9. The method of claim 4 in which a fluid filler is introduced through the at least one hole in said cap surrounding the micromachined element.

10. The method of claim 6 in which the cap hole is closed to seal the cap.

11. The method of claim 6 in which a fluid filler is introduced through the at least one hole in said cap surrounding the micromachined element.

12. The method of claim 9 in which said cap hole is closed to seal in the fluid.

13. The method of claim 9 in which said cap hole is small and the surface tension of the fluid prevents its escape.

14. The method of claim 1 in which fabricating a cap includes forming a contact tip on said cap.

15. The method of claim 14 in which said micromachined element includes a switch and said contact tip is a terminal of said switch.

16. The method of claim 15 in which fabricating a cap includes forming a gate electrode on said cap for operating said switch.

17. A method of fabricating an in-situ cap for an integrated circuit element comprising: fabricating an integrated circuit element on a substrate; forming a support layer over said integrated circuit element; and forming a cap structure in said support layer covering said integrated circuit element.

18. The method of claim 17 further including removing the support layer within said cap structure.

19. The method of claim 17 in which forming said cap structure includes forming a cap hole around said element.

20. The method of claim 19 in which forming said cap structure includes filling said cap hole to form a cap wall and covering said support layer to form a top connected with said cap wall.

21. The method of claim 17 in which said cap is formed with at least one hole and removing the support layer includes introducing a release agent through said hole in said cap.

22. The method of claim 17 in which said substrate is formed with at least one hole and removing the support layer includes introducing a release agent through said hole in said substrate.

23. The method of claim 21 in which the cap hole is closed to seal the cap.

24. The method of claim 21 in which a fluid filler is introduced through the cap hole into the cap surrounding the micromachined device.

25. The method of claim 24 in which said cap hole is closed to seal in the fluid.

26. The method of claim 24 in which the fluid is,a crosslinkable material.

27. The method of claim 21 in which a gas is introduced through the cap hole into the cap to modify at least one surface inside the cap.

28. The method of claim 24 in which said cap hole is small and the surface tension of the fluid prevents its escape.

29. The method of claim 17 in which fabricating a cap includes forming a contact tip on said cap.

30. The method of claim 29 in which said integrated circuit element includes a switch and said contact tip is a terminal of said switch.

31. The method of claim 30 in which fabricating a cap includes forming a gate electrode on said cap for operating said switch.

* * * * *